United States Patent
Sakanishi

(10) Patent No.: US 11,698,588 B2
(45) Date of Patent: Jul. 11, 2023

(54) SUBSTRATE HYDROPHILIZING AGENT

(71) Applicant: DAICEL CORPORATION, Osaka (JP)

(72) Inventor: Yuichi Sakanishi, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 338 days.

(21) Appl. No.: 16/971,970

(22) PCT Filed: Jan. 30, 2019

(86) PCT No.: PCT/JP2019/003222
§ 371 (c)(1),
(2) Date: Aug. 21, 2020

(87) PCT Pub. No.: WO2019/163455
PCT Pub. Date: Aug. 29, 2019

(65) Prior Publication Data
US 2020/0393765 A1    Dec. 17, 2020

(30) Foreign Application Priority Data
Feb. 22, 2018    (JP) .................... 2018-029605

(51) Int. Cl.
*G03F 7/11* (2006.01)
*G03F 7/00* (2006.01)
*H01L 21/027* (2006.01)

(52) U.S. Cl.
CPC .............. *G03F 7/11* (2013.01); *G03F 7/0002* (2013.01); *H01L 21/0274* (2013.01)

(58) Field of Classification Search
CPC . G03F 7/11; G03F 7/0002; G03F 7/16; H01L 21/0274; H01L 21/306; H01L 21/3081; H01L 21/308
USPC ...................................................... 430/299
See application file for complete search history.

(56) References Cited

U.S. PATENT DOCUMENTS

| 11,279,905 | B2* | 3/2022 | Sakanishi | .......... C11D 17/0008 |
| 2005/0282718 | A1* | 12/2005 | Nakagawa | ............... C11D 3/37 |
| | | | | 510/175 |
| 2010/0298199 | A1* | 11/2010 | Ozeki | ..................... C11D 1/72 |
| | | | | 510/334 |
| 2013/0040070 | A1* | 2/2013 | Jung | ..................... G03F 7/0002 |
| | | | | 427/553 |
| 2015/0337245 | A1 | 11/2015 | Hayama et al. | |
| 2019/0249122 | A1* | 8/2019 | Uchida | ..................... B08B 3/08 |
| 2021/0343542 | A1* | 11/2021 | Sakanishi | ............... C08L 71/08 |

FOREIGN PATENT DOCUMENTS

| JP | 2009-25723 A | 2/2009 |
| TW | 201546266 A | 12/2015 |

OTHER PUBLICATIONS

International Search Report dated Apr. 9, 2019, in PCT/JP2019/003222.
Written Opinion of the International Searching Authority dated Apr. 9, 2014, in PCT/JP2019/003222.
Taiwanese Office Action and Search Report for Taiwanese Application No. 108105307, dated Jul. 28, 2022.

* cited by examiner

*Primary Examiner* — Caleen O Sullivan
(74) *Attorney, Agent, or Firm* — Birch, Stewart, Kolasch & Birch, LLP

(57) ABSTRACT

Provided is a substrate hydrophilizing agent that improves the wettability of a substrate surface with respect to a photoresist. A substrate hydrophilizing agent of the present invention is an agent for hydrophilizing a surface of a substrate on which a pattern is formed through photolithography, and contains at least the following Component (A) and Component (B).

Component (A): a water-soluble oligomer having a weight average molecular weight from 100 to less than 10000.
Component (B): water.
The water-soluble oligomer of Component (A) is preferably a compound represented by the following Formula (a-1):

$$R^{a1}O-(C_3H_6O_2)_n-H \quad (a-1)$$

(where $R^{a1}$ represents a hydrogen atom, a hydrocarbon group which may have a hydroxyl group, or an acyl group; and n is an integer from 2 to 60.)

13 Claims, No Drawings

SUBSTRATE HYDROPHILIZING AGENT

TECHNICAL FIELD

The present invention relates to an agent for hydrophilizing a substrate subjected to pattern formation through photolithography, and to a method of producing a semiconductor element using the substrate hydrophilizing agent. The present application claims priority from the Japanese Patent Application No. 2018-029605 filed on Feb. 22, 2018 in Japan, the contents of which are hereby incorporated herein.

BACKGROUND ART

In the production of semiconductor devices (such as transistors, capacitors, memories, light emitting elements, and solar cells) and electronic equipment (such as various displays), a photolithography method including the following steps, for example, is used as a method of forming a circuit on a substrate (see Patent Document 1, for example):

[1] applying a photoresist onto a substrate to form a resist coating film;

[2] irradiating the resist coating film with light through a photomask having a circuit pattern drawn thereon, and baking the circuit pattern;

[3] immersing in a developing solution to remove an unnecessary portion of the resist coating film; and

[4] after development, using the resist coating film remaining on the substrate as a mask, and etching the substrate.

However, the surface of the substrate on which the resist coating film is formed exhibits poor wettability of the photoresist, and it is difficult to uniformly form a resist coating film due to the occurrence of cissing. In addition, adherence between the surface of the substrate and the resist coating film is poor. Furthermore, with the progression of miniaturization of circuit patterns in association with higher integration of semiconductors, a problem of reduced pattern precision due to the use of an uneven or poorly adherent resist coating film has become apparent.

CITATION LIST

Patent Document

Patent Document 1: JP 2009-025723 A

SUMMARY OF INVENTION

Technical Problem

Therefore, an object of the present invention is to provide a substrate hydrophilizing agent that improves the wettability of the substrate surface with respect to the photoresist.

Another object of the present invention is to provide a method of producing a semiconductor element having fine, high precision circuits through photolithography.

Solution to Problem

As a result of diligent research to solve the problems described above, the present inventors discovered that a composition containing the following components can adhere to a surface of a substrate and thereby hydrophilize the substrate surface, and that the photoresist exhibits good wettability with respect to the substrate surface that is made hydrophilic by the composition. Therefore, when the photoresist is coated onto the substrate surface, a resist coating film excelling in uniformity and adherence can be obtained, and if a resist coating film obtained in this manner is used, a fine, high precision circuit pattern can be reliably formed, and when this is used as a mask, a fine, high precision circuit can be formed on the substrate surface. The present invention was completed based on these findings.

That is, the present invention provides a substrate hydrophilizing agent for hydrophilizing a surface of a substrate on which a pattern is formed through photolithography, the substrate hydrophilizing agent including at least Component (A) and Component (B) below:

Component (A): a water-soluble oligomer having a weight average molecular weight from 100 to less than 10000, and Component (B): water.

The present invention also provides the substrate hydrophilizing agent described above, where the water-soluble oligomer of Component (A) is a compound represented by Formula (a-1) below:

$$R^{a1}O\text{---}(C_3H_6O_2)_n\text{---}H \qquad (a\text{-}1)$$

(where $R^{a1}$ represents a hydrogen atom, a hydrocarbon group having from 1 to 18 carbons, which may have a hydroxyl group, or an acyl group having from 2 to 24 carbons; and n is an integer from 2 to 60, which represents an average degree of polymerization of glycerol units in parentheses).

The present invention also provides the substrate hydrophilizing agent described above, wherein a content of Component (A) is not less than 0.1 wt. % of a total amount of the substrate hydrophilizing agent.

The present invention also provides a method of producing a semiconductor element including the following steps:

step (1): hydrophilizing a semiconductor substrate surface using the substrate hydrophilizing agent described above;

step (2): forming a resist coating film on the hydrophilized semiconductor substrate surface;

step (3): exposing and developing the resist coating film so as to form a resist pattern for lithography; and step (4): etching the substrate using the resist pattern.

Advantageous Effects of Invention

The substrate hydrophilizing agent of the present invention readily adheres to the substrate surface to form a hydrophilic coating, and through the formation of the coating, the substrate surface can be stably hydrophilized, and the wettability of the photoresist can be improved. Therefore, when a photoresist is coated onto the substrate surface hydrophilized by the substrate hydrophilizing agent of the present invention, a resist coating film excelling in uniformity and adherence can be formed, and if this resist coating film is used, a high precision resist pattern can be formed. Furthermore, if the high precision resist pattern is used, a fine, high precision circuit can be formed on the substrate surface through photolithography.

Therefore, when the substrate hydrophilizing agent of the present invention is used, semiconductor elements having fine, high precision circuits can be produced efficiently (or with high yield or high probability).

DESCRIPTION OF EMBODIMENTS

Substrate Hydrophilizing Agent

A substrate hydrophilizing agent according to an embodiment of the present invention is an agent for hydrophilizing a surface of a substrate on which a pattern is formed through photolithography, and contains at least the following Components (A) and (B):

Component (A): a water-soluble oligomer having a weight average molecular weight from 100 to less than 10000, and Component (B): water.

Component (A)

In the present invention, Component (A) is a water-soluble oligomer. The weight average molecular weight of the water-soluble oligomer is from 100 to less than 10000. The lower limit of the weight average molecular weight is preferably 300, more preferably 500, particularly preferably 1000, most preferably 1500, especially preferably 2000, and even more preferably 2500. The upper limit of the weight average molecular weight is preferably 8000, more preferably 6000, particularly preferably 5000, most preferably 4000, and especially preferably 3500. The water-soluble oligomer having a weight average molecular weight within the range described above excels particularly in adherence to the substrate surface, and thus tightly adheres to the substrate surface and imparts hydrophilicity. On the other hand, when the molecular weight falls below the range described above, adhesion to the substrate decreases, and the hydrophilization capacity tends to decline. When the molecular weight exceeds the above-mentioned range, obtaining a high precision resist pattern tends to be difficult. Note that the weight-average molecular weight in the present specification is the molecular weight measured by gel permeation chromatography (GPC) based on calibration with a polystyrene standard.

In an environment at room temperature and atmospheric pressure, the solubility of the water-soluble oligomer is, for example, at least 1 g per 100 g of water.

Examples of the water-soluble oligomer include compounds represented by Formula (a-1) below:

$$R^{a1}O-(C_3H_6O_2)_n-H \quad (a-1)$$

(where $R^{a1}$ represents a hydrogen atom, a hydrocarbon group having from 1 to 18 carbons, which may have a hydroxyl group, or an acyl group having from 2 to 24 carbons; and n is an integer from 2 to 60, which represents an average degree of polymerization of glycerol units in parentheses).

In Formula (a-1), each $C_3H_6O_2$ of a quantity n may be the same or different, and has structure as shown in Formula (I) or (II) below:

$$-CH_2-CHOH-CH_2O- \quad (I)$$

$$-CH(CH_2OH)CH_2O- \quad (II)$$

Examples of the hydrocarbon group having from 1 to 18 carbons of $R^{a1}$ include alkyl groups having from 1 to 18 carbons, alkenyl groups having from 2 to 18 carbons, alkapolyenyl groups having from 4 to 18 carbons, alicyclic hydrocarbon groups having from 3 to 18 carbons, aromatic hydrocarbon groups having from 6 to 18 carbons, and groups in which two or more of these are linked.

Examples of the alkyl group having from 1 to 18 carbons include linear or branched alkyl groups, such as methyl, ethyl, n-propyl, 2-methyl-1-propyl, n-butyl, t-butyl, 3,3-dimethyl-2-butyl, n-pentyl, isopentyl, t-amyl, n-hexyl, 2-ethylhexyl, n-octyl, isooctyl, n-decyl, 4-decyl, isodecyl, dodecyl (=n-lauryl), isododecyl, tetradecyl myristyl), isomyristyl, cetyl, isocetyl, n-hexyldecyl, 2-hexyldecyl, stearyl, isostearyl groups. Among these, a linear or branched alkyl group having from 8 to 18 carbons is preferable.

Examples of the alkenyl group having from 2 to 18 carbons include linear or branched alkenyl groups, such as a vinyl group, an allyl group, a 2-butenyl group, a propenyl group, a hexenyl group, a 2-ethylhexenyl group, and an oleyl group.

Examples of the alkapolyenyl group having from 4 to 18 carbons include alkadienyl groups such as butadienyl, pentadienyl, hexadienyl, heptadienyl, octadienyl, linoleyl, and linolyl groups; alkatrienyl groups such as 1,2,3-pentatrienyl; and an alkatetraenyl group.

Examples of the alicyclic hydrocarbon group having from 3 to 18 carbons include saturated or unsaturated alicyclic hydrocarbon groups (particularly cycloalkyl groups and cycloalkenyl groups) such as cyclobutyl, cyclopentyl, cyclohexyl, cyclooctyl, cyclododecyl, 2-cycloheptenyl, and 2-cyclohexenyl groups.

Examples of the aromatic hydrocarbon group having from 6 to 18 carbons include a phenyl group and a naphthyl group.

Examples of groups obtained by linking two or more of the groups include benzyl, 2-phenylethenyl, 1-cyclopentylethyl, 1-cyclohexylethyl, cyclohexylmethyl, 2-cyclohexylethyl, and 1-cyclohexyl-1-methyl ethyl groups.

The acyl group having from 2 to 24 carbons includes an aliphatic acyl group and an aromatic acyl group. Examples of the aliphatic acyl group include saturated or unsaturated aliphatic acyl groups such as acetyl, propionyl, butyryl, isobutyryl, stearoyl, and oleoyl groups. Examples of the aromatic acyl group include benzoyl, toluoyl, and naphthoyl groups.

Among $R^{a1}$, a hydrogen atom, a linear or branched alkyl group (in particular, a linear or branched alkyl group having from 8 to 18 carbons, and more particularly a linear or branched alkyl group having from 10 to 18 carbons), a linear chain or branched alkenyl group (in particular, a linear or branched alkenyl group having from 2 to 18 carbons, and more particularly, a linear or branched alkenyl group having from 2 to 8 carbons), or an aliphatic acyl group (in particular, a saturated aliphatic acyl group having from 10 to 18 carbons) is preferable, and a hydrogen atom, the alkyl group, or the alkenyl group is particularly preferable.

In Formula (a-1), n represents an average degree of polymerization of glycerol units indicated in parentheses. The value of n is an integer from 2 to 60, and the lower limit of the value of n is preferably 5, more preferably 10, even more preferably 15, particularly preferably 20, most preferably 25, and above all, most preferably 30. The upper limit of the value of n is preferably 55, more preferably 50, particularly preferably 45, most preferably 43, and above all, most preferably 40. A compound represented by Formula (a-1), where n is within the aforementioned range, readily adheres to the surface of a substrate to form a coating, and through the formation of the coating, the surface of the resist coating film can be stably hydrophilized.

As the compound represented by Formula (a-1) above, use of at least one selected from compounds represented by Formulas (a-1-1) to (a-1-9) below is particularly preferable.

$$HO-(C_3H_6O_2)_{10}-H \quad (a-1-1)$$

$$HO-(C_3H_6O_2)_{20}-H \quad (a-1-2)$$

$$HO-(C_3H_6O_2)_{30}-H \quad (a-1-3)$$

$$HO-(C_3H_6O_2)_{40}-H \quad (a-1-4)$$

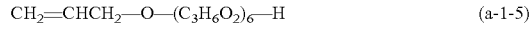

$$CH_2=CHCH_2-O-(C_3H_6O_2)_6-H \quad (a-1-5)$$

$$C_{12}H_{25}O-(C_3H_6O_2)_4-H \quad (a-1-6)$$

$C_{12}H_{25}$—O—$(C_3H_6O_2)_{10}$—H  (a-1-7)

$C_{18}H_{37}$—O—$(C_3H_6O_2)_4$—H  (a-1-8)

$C_{18}H_{37}$—O—$(C_3H_6O_2)_{10}$—H  (a-1-9)

Of the compounds represented by Formula (a-1) above, as compounds for which $R^{a1}$ in the formula is a hydrogen atom, commercially available products can be suitably used, including those under trade names of, for example, "PGL 03P" (polyglycerol-3), "PGL 06" (polyglycerol-6), "PGL 10PSW" (polyglycerol-10), "PGL 20PW" (polyglycerol-20), and "PGL XPW" (polyglycerol-40) (the above-mentioned are available from Daicel Corporation).

Among the compounds represented by Formula (a-1), a compound in which $R^{a1}$ is a hydrocarbon group that has from 1 to 18 carbons and may have a hydroxyl group, or is an acyl group having from 2 to 24 carbons, can be produced using various methods, including, for example, the methods described below.

(1) A method of subjecting 2,3-epoxy-1-propanol to addition polymerization to $R^{a1}$ OH ($R^{a1}$ is the same as above).

(2) A method in which an alkyl halide (for example, $R^{a2}$X: wherein X represents a halogen atom, and $R^{a2}$ represents a hydrocarbon group having from 1 to 18 carbons), a carboxylic acid (for example, $R^{a3}$OH: wherein $R^{a3}$ represents an acyl group having from 2 to 24 carbons), or a derivative thereof (for example, a carboxylic acid halide, an acid anhydride) is condensed to a polyglycerol.

In the method (1) above, the addition reaction is preferably carried out in the presence of an alkali catalyst. Examples of the alkali catalyst include sodium hydroxide, potassium hydroxide, lithium hydroxide, metallic sodium, and sodium hydride. These alkali catalysts can be used singly or in a combination of two or more.

A commercially available product described above can be suitably used as the polyglycerol used as a raw material in the method (2).

The substrate hydrophilizing agent according to an embodiment of the present invention preferably contains one or more types of compounds represented by Formula (a-1) as Component (A). In addition, the substrate hydrophilizing agent according to an embodiment of the present invention may include a polyglycerol diether and a polyglycerol diester, in which case, the proportion of the compound represented by Formula (a-1) relative to the total of the compound represented by Formula (a-1), the polyglycerol diether, and the polyglycerol diester is preferably not less than 75% from the perspective of achieving an excellent hydrophilization effect on the surface of the substrate, and is particularly preferably not less than 90%. Furthermore, from the perspective of achieving an excellent hydrophilization effect on the surface of the substrate, the proportion of the polyglycerol diether and the polyglycerol diester is preferably 5% or less of the total amount of Component (A) (or of the content of the compound represented by Formula (a-1)), and is particularly preferably 1% or less. The proportion of each component can be determined from the area ratio obtained by eluting each component using high performance liquid chromatography, and calculating the peak area using a differential refractive index detector.

The content of Component (A) in the substrate hydrophilizing agent according to an embodiment of the present invention is, for example, 0.1 wt. % or greater, preferably from 0.1 to 5.0 wt. %, more preferably from 0.3 to 4.0 wt. %, particularly preferably from 0.5 to 3.0 wt. % and most preferably from 0.5 to 2.5 wt. % of the total amount (100 wt. %) of the substrate hydrophilizing agent.

Component (B)

The substrate hydrophilizing agent according to an embodiment of the present invention contains water as an essential component. The water may be hard water or soft water, and for example, industrial water, tap water, ion exchanged water, or distilled water can be used.

In the substrate hydrophilizing agent according to an embodiment of the present invention, the content of water is, for example, from 80.0 to 99.9 wt. %, preferably from 85.0 to 99.9 wt. %, more preferably from 90.0 to 99.8 wt. %, and particularly preferably from 95.0 to 99.5 wt. % of the total amount (100 wt. %) of the substrate hydrophilizing agent.

Method of Producing Substrate Hydrophilizing Agent

The substrate hydrophilizing agent according to an embodiment of the present invention contains Components (A) and (B) as essential components. The substrate hydrophilizing agent according to an embodiment of the present invention may contain one or more other components in addition to Component (A) and Component (B).

Examples of the other components include anionic surfactants (such as polycarboxylate-based, polyacrylate-based, and alkylbenzenesulfonate-based surfactants), cationic surfactants (such as quaternary ammonium salts including, for example, alkyl trimethyl ammonium chloride and alkyl pyridinium chloride), nonionic surfactants (such as acetylenediol-based surfactants, polyoxyalkylene alkyl ethers, polyoxyethylene alkyl amines, and polyvinyl pyrrolidone), water-soluble polymer compounds (such as celluloses and chitosans), organic bases (such as TMAH and diethylethanolamine), and alcohols (such as methanol, ethanol, and isopropyl alcohol).

In addition, the proportion of the total content of Components (A) and (B) in the total amount (100 wt. %) of the substrate hydrophilizing agent according to an embodiment of the present invention is, for example, not less than 70 wt. %, preferably not less than 80 wt. %, particularly preferably not less than 90 wt. %, and most preferably not less than 95 wt. %. Note that the upper limit is 100 wt. %. Thus, the content of the other components (if two or more other components are contained, the total amount of these components) is, for example, 30 wt. % or less, preferably 20 wt. % or less, more preferably 10 wt. % or less, and most preferably 5 wt. % or less, based on the total amount (100 wt. %) of the substrate hydrophilizing agent according to an embodiment of the present invention.

The substrate hydrophilizing agent according to an embodiment of the present invention can be prepared by mixing Component (A) and Component (B) with other components as necessary.

Method of Producing a Semiconductor Element

The method of producing a semiconductor element according to an embodiment of the present invention includes the following steps:

step (1): hydrophilizing a semiconductor substrate surface using the substrate hydrophilizing agent described above;

step (2): forming a resist coating film on the hydrophilized semiconductor substrate surface;

step (3): exposing and developing the resist coating film so as to form a resist pattern for lithography; and step (4): etching the substrate using the resist pattern.

In the present invention, "hydrophilizing a semiconductor substrate surface" means imparting hydrophilicity to the surface of the semiconductor substrate, and can be evaluated by wettability to water. For example, if the surface of the semiconductor substrate remains wet after the semiconductor substrate has been immersed in pure water and then withdrawn, the semiconductor substrate surface can be evaluated as being hydrophilic, and if water on the surface of the semiconductor substrate is repelled after the semiconductor substrate has been withdrawn from the pure water, the semiconductor substrate surface can be evaluated as being hydrophobic.

The method of hydrophilizing a semiconductor substrate surface using the substrate hydrophilizing agent described above is not particularly limited as long as the substrate hydrophilizing agent can be brought into contact with the surface of the semiconductor substrate. Examples of the method of contacting the substrate hydrophilizing agent with the surface of the semiconductor substrate include (1) a spraying method, (2) a dripping method, (3) an immersion method, and (4) a spin coating method.

For example, with the (1) spraying method, (2) dripping method, and (4) spin coating method, the substrate hydrophilizing agent is sprayed or dripped onto the surface of the semiconductor substrate from a nozzle disposed above the semiconductor substrate while the semiconductor substrate is rotated, and thereby the substrate hydrophilizing agent can be applied over the entire surface of the semiconductor substrate, and the semiconductor substrate surface can be made hydrophilic.

With the (3) immersion method, the semiconductor substrate is immersed in the substrate hydrophilizing agent, and thereby the surface thereof can be made hydrophilic.

With all of these methods, the time required for the hydrophilization treatment is, for example, from 5 seconds to 60 seconds, and preferably from 10 seconds to 30 seconds. When the treatment time is short, the hydrophilization becomes insufficient, and if the treatment time is too long, operation efficiency declines, which is not preferable. Furthermore, the substrate hydrophilizing agent according to an embodiment of the present invention has high wettability on the surface of the semiconductor substrate, and therefore if the dripping method is used, the amount of the substrate hydrophilizing agent required to coat the entire surface of the semiconductor substrate is reduced, allowing for a reduction in costs.

The resist for forming the resist coating film includes a positive resist and a negative resist. In the present invention, of these, use of a positive resist is preferable from the perspective of being able to form a fine pattern with higher precision.

The positive resist is not particularly limited, and examples thereof include novolac resins, polyacrylic acids, poly-p-hydroxystyrene, polynorbornene resin, and resins obtained by introducing fluorine into these resins.

Examples of the method for forming a resist coating film on the surface of a semiconductor substrate that has been hydrophilized include a method in which a resist is applied using a spin coating method, a roll coating method, a dipping method, a spraying method, a curtain flow coating method, a screen printing method, an offset printing method, or a gravure coating method. The approximate thickness of the resist coating film is, for example, from several hundred nanometers to several micrometers.

The obtained resist coating film may be pre-baked before being subjected to an exposure treatment. Further, baking may be performed after the exposure treatment. The adherence between the substrate and the resist coating film can be improved by performing pre-baking or baking. The treatment temperature is, for example, from 100 to 150° C., and the treatment time is approximately, for example, from 1 to 30 minutes.

When the resist is a positive resist, use of an alkaline developing solution for development is preferable. The alkaline developing solution can include one or more selected from, for example, inorganic bases (such as sodium hydroxide, potassium hydroxide, sodium carbonate, sodium silicate, sodium metasilicate, and aqueous ammonia), primary amines (such as ethylamine and n-propylamine), secondary amines (such as diethylamine and di-n-butylamine), tertiary amines (such as triethylamine and methyldiethylamine), alcohol amines (such as dimethylethanolamine and triethanolamine), quaternary ammonium salts (such as tetramethylammonium hydroxide and tetraethylammonium hydroxide), and cyclic amines (such as pyrrole and piperidine). A surfactant can also be included as necessary.

A step of washing using a rinsing liquid (for example, water), a drying step, and the like are preferably provided after development.

According to the method of producing a semiconductor element of the present invention, a resist coating film having excellent uniformity and adherence can be used to form a high precision resist pattern. In addition, when the semiconductor substrate surface is etched using, as a mask, the high precision resist pattern obtained in this manner, a semiconductor element having a high precision circuit is obtained.

EXAMPLES

Hereinafter, the present invention will be described more specifically with reference to examples, but the present invention is not limited by these examples.

Examples 1 to 4, Comparative Examples 1 to 7

Substrate hydrophilizing agents were prepared by dissolving the water-soluble oligomer in pure water according to the formulations described in Table 1.

A silicon wafer was immersed in each substrate hydrophilizing agent obtained in Examples and Comparative Examples for 10 seconds at 25° C. During immersion of the silicon wafer, the substrate hydrophilizing agent was not stirred. The silicon wafer was then removed from the substrate hydrophilizing agent, and subsequently rinsed under a flow of ultrapure water for 3 minutes.

Wettability of the silicon wafer surface after rinsing was visually observed, and the hydrophilization capacity of the substrate hydrophilizing agent was evaluated on the basis of the following criteria.
Evaluation Criteria
Good: The entire surface of the resist remained wet after rinsing.
Poor: After rinsing, water was immediately repelled or gradually repelled.

A silicon wafer was immersed in each substrate hydrophilizing agent obtained in the Examples and Comparative Examples for 10 seconds at 25° C. During immersion of the silicon wafer, the substrate hydrophilizing agent was not stirred. Subsequently, the surface of the silicon wafer removed from the substrate hydrophilizing agent was spin coated with a positive resist (trade name "820", available from Nagase & Co., Ltd.), the solvent was removed from the obtained coating film, the coated silicon wafer was further baked for 10 minutes at 120° C., and a resin coating film was obtained (film thickness of approximately 17000 Å).

The obtained resist coating film was subjected to an exposure treatment using an ArF excimer laser (wavelength: 193 nm) through a mask.

After the exposure treatment, the resist coating film was subjected to a development treatment for 60 seconds using an alkaline developing solution (an aqueous solution containing 2.38% tetramethyl ammonium hydroxide). Next, the resist coating film was washed with a rinsing liquid (using pure water) and dried, and a test piece on which a resist pattern was formed was obtained. This test was performed multiple times.

The state of the resist pattern of each of the obtained plurality of test pieces was observed, and the precision was evaluated based on the following criteria.

Evaluation Criteria

Good: The pattern precision was good for all of the plurality of test pieces.

Marginal: Some test pieces had good pattern precision, but portions where pattern precision was poor were present in the other test pieces.

Poor: Portions where pattern precision was poor were present in all of the plurality of test pieces.

TABLE 1

| | Substrate Hydrophilizing Agent | | | |
|---|---|---|---|---|
| | Water-Soluble Oligomer (wt. %) | Water (wt. %) | Hydro-philization Capacity | Resist Pattern Precision |
| Example 1 | A-1 (2) | 98 | Good | Good |
| Example 2 | A-1 (1.5) | 98.5 | Good | Good |
| Example 3 | A-1 (1) | 99 | Good | Good |
| Example 4 | A-1 (0.5) | 99.5 | Good | Good |
| Comparative Example 1 | B-1 (1) | 99 | Poor | Marginal |
| Comparative Example 2 | B-2 (1) | 99 | Poor | Marginal |
| Comparative Example 3 | B-3 (1) | 99 | Poor | Marginal |
| Comparative Example 4 | B-4 (1) | 99 | Poor | Marginal |
| Comparative Example 5 | B-5 (1) | 99 | Good | Poor |
| Comparative Example 6 | B-6 (1) | 99 | Good | Poor |
| Comparative Example 7 | B-7 (1) | 99 | Good | Poor |

The codes in the table represent the following compounds:

(A-1): polyglycerol-40, trade name "PGL XPW", weight average molecular weight: 2981, available from Daicel Corporation (B-1): tetramethylammonium hydroxide (B-2): 2-hydroxyethyl-(N,N-dimethyl-N-lauryl)ammonium hydroxide (B-3): 2-hydroxyethyl-(N,N-dimethyl-N-myristyl)ammonium hydroxide (B-4): 2-hydroxyethyl-(N,N-dimethyl-N-stearyl)ammonium hydroxide (B-5): hydroxyethyl cellulose (molecular weight: 250000)

(B-6): polyvinylpyrrolidone (molecular weight: 40000)

(B-7): polyethylene glycol (molecular weight: 20000)

To summarize the above, configurations and variations according to an embodiment of the present invention will be described below.

[1] A substrate hydrophilizing agent for hydrophilizing a surface of a substrate on which a pattern is formed through photolithography, the substrate hydrophilizing agent including at least Components (A) and (B) below:

Component (A): a water-soluble oligomer having a weight average molecular weight from 100 to less than 10000, and Component (B): water.

[2] The substrate hydrophilizing agent according to [1], wherein the water-soluble oligomer of Component (A) is a compound represented by Formula (a-1) below:

$$R^{a1}O\text{—}(C_3H_6O_2)_n\text{—}H \qquad (a\text{-}1)$$

(where $R^{a1}$ represents a hydrogen atom, a hydrocarbon group having from 1 to 18 carbons, which may have a hydroxyl group, or an acyl group having from 2 to 24 carbons; and n is an integer from 2 to 60, which represents an average degree of polymerization of glycerol units in parentheses).

[3] The substrate hydrophilizing agent according to [2], wherein the compound represented by Formula (a-1) is at least one compound selected from compounds represented by Formulas (a-1-1) to (a-1-9).

[4] The substrate hydrophilizing agent according to any one of [1] to [3], wherein a total content of a polyglycerol diether and a polyglycerol diester is 5% or less of the total amount of the Component (A).

[5] The substrate hydrophilizing agent according to any one of [1] to [4], wherein the Component (A) contains a compound represented by Formula (a-1), and may further contain a polyglycerol diether and/or a polyglycerol diester, and a total content of the polyglycerol diether and the polyglycerol diester is 5% or less of the content of the compound represented by Formula (a-1).

[6] The substrate hydrophilizing agent according to any one of [1] to [5], wherein the Component (A) contains a compound represented by Formula (a-1), and may further contain a polyglycerol diether and/or a polyglycerol diester, and a proportion of the content of the compound represented by Formula (a-1) relative to the total content of the compound represented by Formula (a-1), the polyglycerol diether, and polyglycerol diester is 75% or greater.

[7] The substrate hydrophilizing agent according to any one of [1] to [6], wherein the content of Component (A) is not less than 0.1 wt. % of the total amount of the substrate hydrophilizing agent.

[8] The substrate hydrophilizing agent according to any one of [1] to [7], wherein the content of Component (B) is from 80.0 to 99.9 wt. % of the total amount of the substrate hydrophilizing agent.

[9] The substrate hydrophilizing agent according to any one of [1] to [8], wherein a total content of the Component (A) and the Component (B) is not less than 70 wt. % of the total amount of the substrate hydrophilizing agent.

[10] The substrate hydrophilizing agent according to any one of [1] to [9], wherein a content of components other than the Component (A) and the Component (B) is not greater than 30 wt. % of the total amount of the substrate hydrophilizing agent.

[11] A method of producing a semiconductor element including the steps described below:

step (1): hydrophilizing a semiconductor substrate surface using a substrate hydrophilizing agent described in any one of [1] to [10];

step (2): forming a resist coating film on the hydrophilized semiconductor substrate surface;

step (3): exposing and developing the resist coating film so as to form a resist pattern for lithography; and step (4): etching the substrate using the resist pattern.

INDUSTRIAL APPLICABILITY

The substrate hydrophilizing agent of the present invention readily adheres to a substrate surface to form a hydrophilic coating, and through the formation of the coating, the substrate surface can be stably hydrophilized, and the wettability of a photoresist can be improved. Therefore, when the substrate hydrophilizing agent of the present invention is used, semiconductor elements having fine, high precision circuits can be efficiently produced.

The invention claimed is:

1. A substrate hydrophilizing agent for hydrophilizing a surface of a substrate on which a pattern is formed through photolithography, the substrate hydrophilizing agent comprising at least Components (A) and (B) below:
   Component (A): a water-soluble oligomer having a weight average molecular weight from 100 to less than 10000, and
   Component (B): water,
   wherein a content of the Component (A) is from 1.5 wt. % to 5.0 wt. % of a total amount of the substrate hydrophilizing agent.

2. The substrate hydrophilizing agent according to claim 1, wherein the water-soluble oligomer of Component (A) is a compound represented by Formula (a-1) below:

(where $R^{a1}$ represents a hydrogen atom, a hydrocarbon group having from 1 to 18 carbons, which may have a hydroxyl group, or an acyl group having from 2 to 24 carbons, and n is an integer from 2 to 60, which represents an average degree of polymerization of glycerol units in parentheses).

3. The substrate hydrophilizing agent according to claim 1, wherein Component (A) is at least one compound selected from compounds represented by Formulas (a-1-1) to (a-1-9) below,

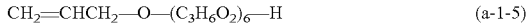

4. The substrate hydrophilizing agent according to claim 1, wherein Component (A) is a compound represented by Formula (a-1) below:

(where $R^{a1}$ represents a hydrogen atom, a hydrocarbon group having from 1 to 18 carbons, which may have a hydroxyl group, or an acyl group having from 2 to 24 carbons, and n is an integer from 2 to 60, which represents an average degree of polymerization of glycerol units in parentheses), and
the substrate hydrophilizing agent may further contain a polyglycerol diether and/or a polyglycerol diester, and a total content of the polyglycerol diether and the polyglycerol diester is 5% or less of the content of the compound represented by Formula (a-1).

5. The substrate hydrophilizing agent according to claim 1, wherein Component (A) is a compound represented by Formula (a-1) below:

(where $R^{a1}$ represents a hydrogen atom, a hydrocarbon group having from 1 to 18 carbons, which may have a hydroxyl group, or an acyl group having from 2 to 24 carbons, and n is an integer from 2 to 60, which represents an average degree of polymerization of glycerol units in parentheses), and
the substrate hydrophilizing agent may further contain a polyglycerol diether and/or a polyglycerol diester, and a proportion of the content of the compound represented by Formula (a-1) relative to the total content of the compound represented by Formula (a-1), the polyglycerol diether, and polyglycerol diester is 75% or greater.

6. The substrate hydrophilizing agent according to claim 1, wherein a total content of Component (A) and Component (B) is not less than 70 wt. % of the total amount of the substrate hydrophilizing agent.

7. A method of producing a semiconductor element comprising:
   step (1): hydrophilizing a semiconductor substrate surface using the substrate hydrophilizing agent described in claim 1;
   step (2): forming a resist coating film on the hydrophilized semiconductor substrate surface;
   step (3): exposing and developing the resist coating film so as to form a resist pattern for lithography; and
   step (4): etching the substrate using the resist pattern.

8. A method of producing a semiconductor element comprising:
   step (1): hydrophilizing a semiconductor substrate surface using a substrate hydrophilizing agent comprising at least Components (A) and (B) below:
   Component (A): a water-soluble oligomer having a weight average molecular weight from 100 to less than 10000, and
   Component (B): water,
   wherein a content of the Component (A) is from 1.5 wt. % to 5.0 wt. % of a total amount of the substrate hydrophilizing agent,
   step (2): forming a resist coating film on the hydrophilized semiconductor substrate surface;
   step (3): exposing and developing the resist coating film so as to form a resist pattern for lithography; and
   step (4): etching the substrate using the resist pattern.

9. The method of producing a semiconductor element according to claim 8, wherein Component (A) is a compound represented by Formula (a-1) below:

(where $R^{a1}$ represents a hydrogen atom, a hydrocarbon group having from 1 to 18 carbons, which may have a hydroxyl group, or an acyl group having from 2 to 24 carbons, and n is an integer from 2 to 60, which represents an average degree of polymerization of glycerol units in parentheses).

10. The method of producing a semiconductor element according to claim 8, wherein Component (A) is at least one compound selected from compounds represented by Formulas (a-1-1) to (a-1-9) below,

$$CH_2\text{=}CHCH_2\text{—}O\text{—}(C_3H_6O_2)_6\text{—}H \quad (a\text{-}1\text{-}5)$$

$$C_{12}H_{25}O\text{—}(C_3H_6O_2)_4\text{—}H \quad (a\text{-}1\text{-}6)$$

$$C_{12}H_{25}O\text{—}(C_3H_6O_2)_{10}\text{—}H \quad (a\text{-}1\text{-}7)$$

$$C_{18}H_{37}\text{—}O\text{—}(C_3H_6O_2)_4\text{—}H \quad (a\text{-}1\text{-}8)$$

$$C_{18}H_{37}\text{—}O\text{—}(C_3H_6O_2)_{10}\text{—}H \quad (a\text{-}1\text{-}9).$$

11. The method of producing a semiconductor element according to claim 8, wherein Component (A) is a compound represented by Formula (a-1) below:

$$R^{a1}O\text{—}(C_3H_6O_2)_n\text{—}H \quad (a\text{-}1)$$

(where $R^{a1}$ represents a hydrogen atom, a hydrocarbon group having from 1 to 18 carbons, which may have a hydroxyl group, or an acyl group having from 2 to 24 carbons, and n is an integer from 2 to 60, which represents an average degree of polymerization of glycerol units in parentheses), and the substrate hydrophilizing agent may further contain a polyglycerol diether and/or a polyglycerol diester, and a total content of the polyglycerol diether and the polyglycerol diester is 5% or less of the content of the compound represented by Formula (a-1).

12. The method of producing a semiconductor element according to claim 8, wherein Component (A) is a compound represented by Formula (a-1) below:

$$R^{a1}O\text{—}(C_3H_6O_2)_nH \quad (a\text{-}1)$$

(where $R^{a1}$ represents a hydrogen atom, a hydrocarbon group having from 1 to 18 carbons, which may have a hydroxyl group, or an acyl group having from 2 to 24 carbons, and n is an integer from 2 to 60, which represents an average degree of polymerization of glycerol units in parentheses), and the substrate hydrophilizing agent may further contain a polyglycerol diether and/or a polyglycerol diester, and a proportion of the content of the compound represented by Formula (a-1) relative to the total content of the compound represented by Formula (a-1), the polyglycerol diether, and polyglycerol diester is 75% or greater.

13. The method of producing a semiconductor element according to claim 8, wherein a total content of Component (A) and Component (B) is not less than 70 wt. % of the total amount of the substrate hydrophilizing agent.

* * * * *